United States Patent
McGaffey et al.

(10) Patent No.: US 6,466,140 B1
(45) Date of Patent: Oct. 15, 2002

(54) PEDESTRIAN PUSH BUTTON ASSEMBLY

(75) Inventors: John F. McGaffey, Murrieta, CA (US); Wayne L. Russell, Ontario (CA); Randy Van Cruz, La Habra, CA (US)

(73) Assignee: Polara Engineering, Inc., Fullerton, CA (US)

( * ) Notice: Subject to any disclaimer, the term of this patent is extended or adjusted under 35 U.S.C. 154(b) by 0 days.

(21) Appl. No.: 09/649,331

(22) Filed: Aug. 28, 2000

(51) Int. Cl.[7] ................................................ G08G 1/095
(52) U.S. Cl. ...................... 340/944; 340/925; 340/944; 200/302.2; 200/510; 200/511
(58) Field of Search ................. 340/944, 407, 340/925, 407.1, 407.2; 200/302.1, 302.2, 341, 520, 181, 510, 511; 310/338, 339, 340

(56) References Cited

U.S. PATENT DOCUMENTS 4,187,418 A * 2/1980 Harris ........................ 200/295
4,618,797 A * 10/1986 Cline ......................... 310/339
5,332,944 A * 7/1994 Cline ......................... 310/339
5,477,942 A   12/1995 Shea et al. .................. 187/395
5,587,567 A   12/1996 Winter et al. ............... 187/395
5,767,465 A * 6/1998 Fulton et al. ............... 200/341
5,920,050 A * 7/1999 Tolman ..................... 200/302.2

* cited by examiner

Primary Examiner—Brent A. Swarthout
(74) Attorney, Agent, or Firm—Edgar W. Averill, Jr.

(57) ABSTRACT

A pedestrian push button assembly for activating a signal generator to generate a signal at a street crosswalk. The pedestrian push button assembly has a rigid frame having a piezoelectric material of a solid state switch positioned across a central aperture, and an elastic sealing ring positioned in a groove surrounding the piezoelectric material. A button is secured to the rigid frame such that (1) a seal contact portion of the button sealably rests against the elastic sealing ring, (2) a very small space separates an abutment surface of the button and a stopper surface of the rigid frame, and (3) an elastic pressure portion of the button contacts the piezoelectric material. When operated, the elastic sealing ring is sufficiently biased to urge the elastic pressure portion against the piezoelectric material to generate a signal pulse.

18 Claims, 2 Drawing Sheets

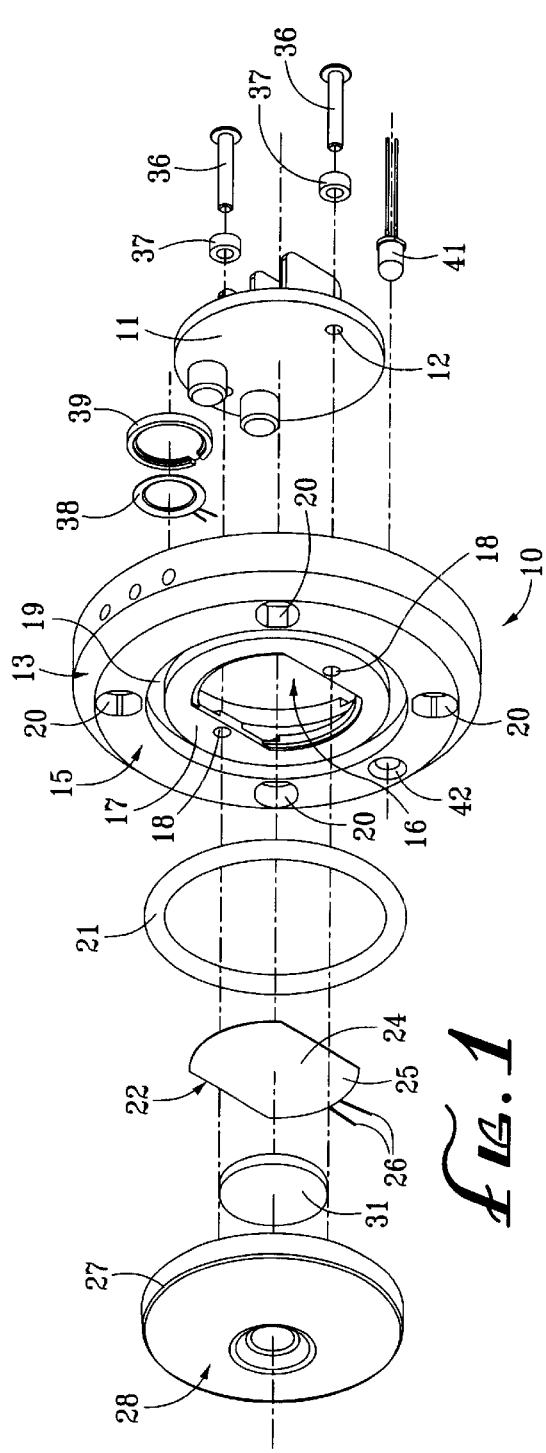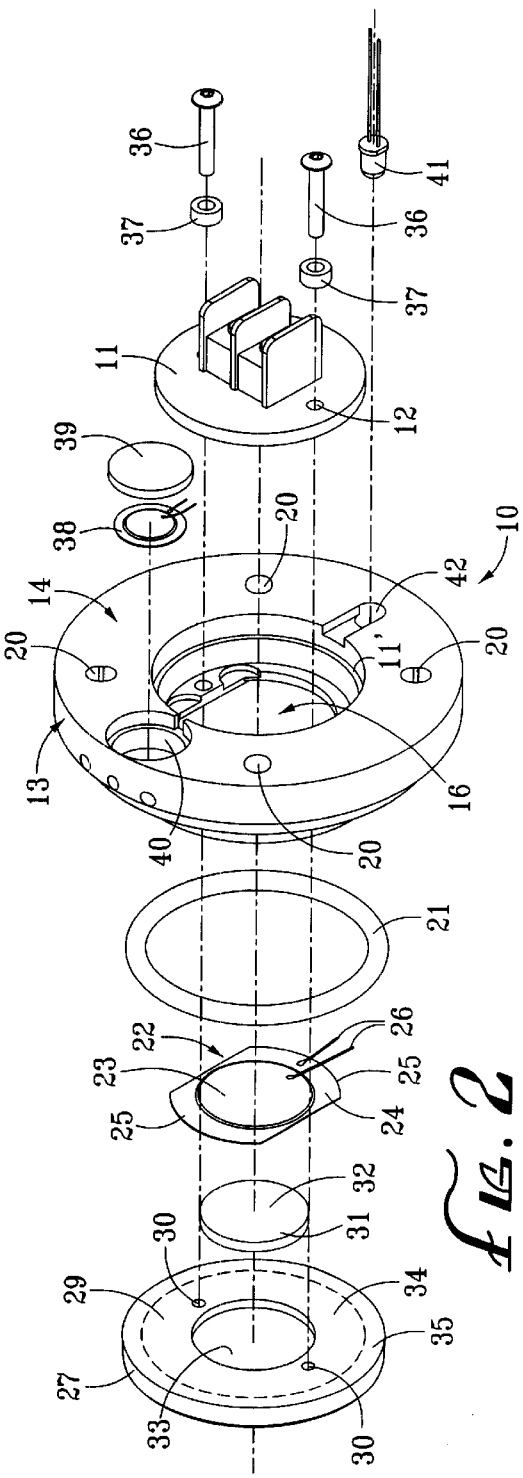

PEDESTRIAN PUSH BUTTON ASSEMBLY

BACKGROUND OF THE INVENTION

The field of the invention generally pertains to push buttons, and more particularly to a weatherproof and vandalproof pedestrian push button assembly for generating a signal at a street crosswalk.

Various types of push button assemblies have been developed and used as a call or signal generator in various electronic devices and systems. Pedestrian push button assemblies and systems, in particular, are widely used at street corners and intersections for assisting pedestrians when crossing a street. While providing a beneficial service to pedestrians, they often become the target of vandalism and abuse, which can diminish the capacity of such systems to operate effectively. It is not uncommon for pedestrian push buttons to be struck with hard objects, such as baseball bats, hockey sticks, skateboards and hammers. Additionally, they are often repeatedly struck by hand in the belief that such actions would speed up the changing of the lights. In other cases, adhesives, such as Super Glue and gum, are used to stick or jam the button mechanism to prevent its operation. Moreover, because pedestrian push buttons are used outside, they are exposed and susceptible to harsh weather and other environmental conditions, such as rain and snow.

It is also known for many push button systems to utilize force-sensitive piezoelectric elements which produce a voltage pulse upon being acted upon by a mechanical pressure. The use of piezoelectric crystals and materials are especially useful in the construction of solid state switches requiring little or no actuating movement or travel. Because such push buttons have little or no contacting parts, such assemblies are useful for a high number of operation cycles with little or no wear.

It In U.S. Pat. No. 5,477,942, an electric push button assembly for elevators is shown having a plunger element with a plug-shaped extension covered with an elastic pressure cap. The elastic pressure cap is positioned adjacent a force-sensitive resister and upon actuation of the plunger element, the elastic pressure cap applies a mechanical pressure against the force-sensitive resister. The plunger element is permanently biased away from the force-sensitive resister by means of a compression spring.

Additionally, in U.S. Pat. No. 5,587,567, a push button panel is shown for use with elevators having a front panel with push button areas on a front surface of the front panel, and elements sensitive to pressure changes positioned behind the front panel. The front panel is made of a material having a high degree of rigidity, such that applying pressure to the front panel induces a signal to be generated by means of the pressure sensitive elements.

While both the '567 and '942 patents disclose push button assemblies utilizing a force-sensitive resister, i.e. piezoelectric element, they are not particularly suitable for outdoor use where they are subject to environmental exposure and conditions. For example, the electronic push button assembly in the '942 patent utilizes a compression spring to resiliently actuate the plunger element. The compression spring, however, is not designed to weatherproof the pushbutton, by sealing or otherwise preventing external elements from reaching the inside. Additionally, because the '567 patent has the pressure sensitive elements positioned directly behind the thin-sheet front panel, they are especially vulnerable to acts of vandalism involving high impact.

Thus, it would be beneficial to have a weatherproof push button assembly designed to withstand the ever-changing and harsh environmental conditions, as well as being essentially impervious and resistant to acts of vandalism.

BRIEF SUMMARY OF THE INVENTION

It is an object of the present invention to provide a weatherproof pedestrian push button assembly for outdoor use, which activates a signal generating device to generate a signal at a street crosswalk.

It is a further object of the present invention to provide a pedestrian push button assembly which is highly impact resistant and resistant to violent acts of vandalism.

It is a still further object of the present invention to provide a push button assembly having a minimal number of moving parts which approximate a solid body when actuated, and having visual and audible notification of signal activation.

The present invention is for a push button assembly for activating signal-generating means to generate a signal at a street crosswalk. In a preferred embodiment, the pedestrian push button assembly comprises a rigid frame having opposing inner and outer frame ends. The outer frame end has a central aperture, a stopper surface located ulterior to the central aperture, and a perimetric groove surrounding the central aperture. The push button assembly also comprises a resiliently-biasing sealing element which is adapted to be seated in a perimetric groove surrounding the central aperture. Furthermore, a piezoelectric element is positioned across the central aperture and electrically connected to the signal-generating means. The piezoelectric element activates the signal-generating means to generate the signal when mechanical pressure is acted thereupon.

The mechanical pressure is supplied by a button portion secured to the rigid frame. The button portion has opposing inner and outer button ends with the inner button end having a resiliently-biasing pressure element mounted thereon. The inner button end also has an abutment surface located ulterior to the resiliently-biasing pressure element, as well as a seal-contact portion surrounding the resiliently-biasing pressure element. The inner button end is adapted to be secured to the outer frame end such that the seal-contact portion sealably contacts the resiliently-biasing sealing element in an unbiased state, the abutment surface confronts the stopper surface, and the resiliently-biasing pressure element contacts the piezoelectric element.

In this manner, upon a pressure being applied against the outer button end, the seal contact portion resiliently-biases the resiliently-biasing sealing element, and the resiliently-biasing pressure element is urged to apply a mechanical pressure against the piezoelectric element. Because the movement is of an incremental magnitude, a user may not perceive button movement. As a result, the piezoelectric element activates the signal generating means to generate the signal.

BRIEF DESCRIPTION OF THE DRAWINGS

FIG. 1 is an exploded front perspective view of the pedestrian push button assembly.

FIG. 2 is an exploded rear perspective view of the pedestrian push button assembly.

DESCRIPTION OF THE PREFERRED EMBODIMENTS

Figure 3:
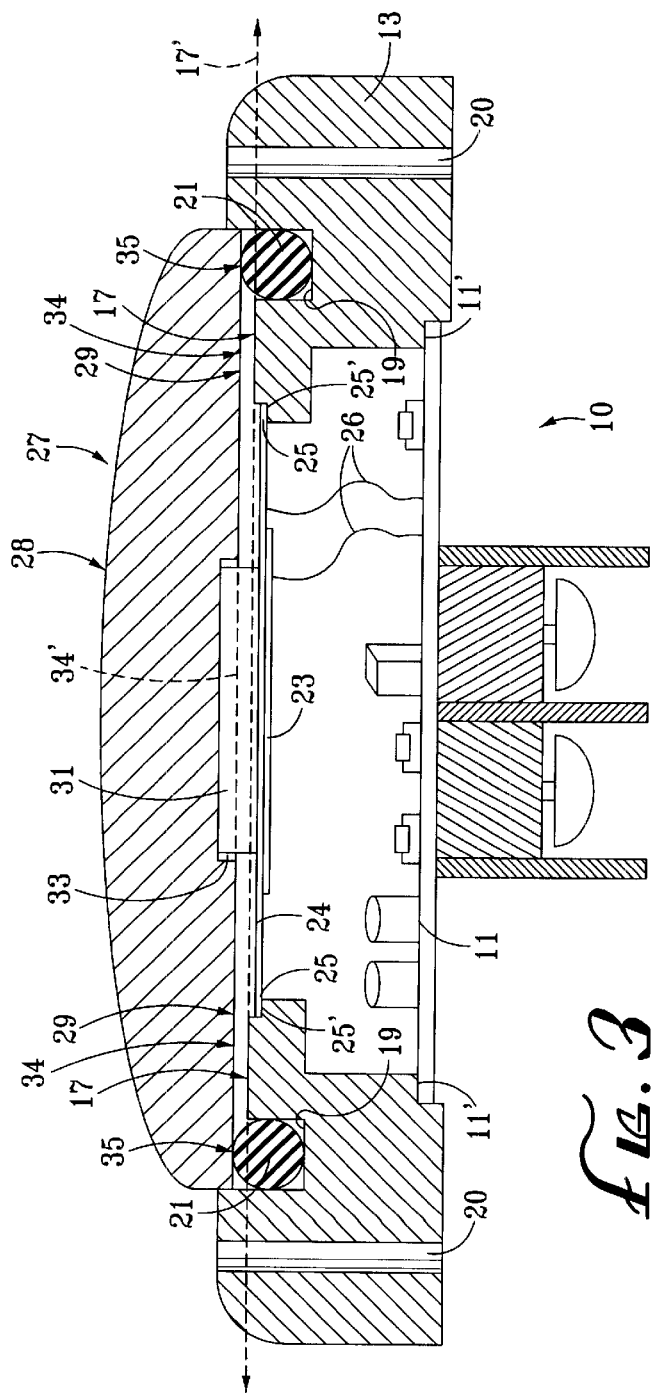
FIGS. 3–4 are cross-sectional view of the pedestrian push button assembly as fully assembled, showing the spatial relationships between the component parts.

Referring now to the drawings, FIGS. 1–3 show the pedestrian push button assembly, generally indicated at reference character 10. The push button assembly 10 is shown having a rigid frame, generally indicated by reference character 13, preferably constructed from a durable impact resistant material, such as a polycarbonate material, or powder coated aluminum. Preferably, as can be seen in FIGS. 1 and 2, the rigid frame 13 has an annular configuration, but is not limited only to such. The rigid frame 13 has an inner frame end 14 and an opposing outer frame end 15. The inner frame end 14 is adapted to be mounted against a push button control module (not shown) of a street crosswalk control system or directly onto a mounting pole. This is generally accomplished by means of fasteners (not shown) mounted through frame mounting holes 20. The fasteners are preferably frame-mounting bolts having head portions of a type known in the relevant industry for inhibiting removal thereof.

The outer frame end 15 has a central aperture 16 which leads between the outer frame end 15 and the inner frame end 14. As can best be seen in FIG. 1, a stopper surface 17 is located ulterior to the central aperture 16. While the stopper surface 17 preferably has a generally annular configuration completely surrounding the central aperture 16, other configurations of the stopper surface 17 are contemplated, such as a pair of stopper portions on opposite sides of the central aperture 16 (not shown). Furthermore, the outer frame end 15 also has a perimetric groove 19 which encircles the central aperture 16. The perimetric groove 19 may be alternatively positioned on an inner button end 29 of the button portion 27, as will be discussed below. The perimetric groove 19 is adapted to seat a resiliently-biasing sealing element 21. The sealing element 21 is preferably made of an elastomeric material, such as rubber, and preferably has an O-ring configuration. As can be seen in FIG. 3, showing a cross-sectional view of a fully assembled pedestrian push button assembly 10, the sealing element 21 is preferably seated snugly into perimetric groove 19 to prevent movement when seated therein, as well as provide a better seal for weatherproofing.

Furthermore, as can be seen in FIGS. 1–3, a piezoelectric element, generally indicated at reference character 22, is positioned across the central aperture 16 and preferably below the stopper plane 17' defined by the stopper surface 17. The piezoelectric element 22 has a piezoelectric portion 23 affixed to a metallic conduit portion 24. The piezoelectric portion 23 may be a single or multi-layered generator mounted to bend in a transverse direction for production of an electric voltage pulse on the surface thereof. The metallic conduit portion 24 has a pair of opposing mounting ends, which preferably mount the piezoelectric element 22 to the rigid frame 13. Particularly, as can be best seen in FIG. 3, the mounting ends 25 are seated on mounting ledges 25', which are positioned diametrically opposite each other along the rim of the central aperture 16. In this manner, the piezoelectric element 22 employs a simple beam configuration where the greatest deflection is at its center. It is understood and contemplated, however, that other support arrangements for the piezoelectric element 22 may be employed, such as a cantilever arrangement, or plastic holding fixture (not shown).

As can be seen in the figures, electrical conduit means, such as a set of wires 26, is connected to both the piezoelectric portion 23 and the metallic conduit portion 24. The wires 26 electrically connect the piezoelectric element 22 to a signal generating means 11, which is preferably a circuit board 11, thereby forming a solid state switch. It is notable that while the signal generating means 11, i.e., circuit board, is shown mounted on the rigid frame 13 along an annular support deck 11' (see FIG. 2), it may alternatively be remotely positioned away from the push button assembly 10. Thus, upon experiencing a mechanical pressure, the piezoelectric element 22 produces a voltage pulse which activates the signal generating means 11 to produce the crossing signal for the pedestrian user.

Additionally, the push button assembly 10 comprises a button portion, generally indicated at reference character 27, and which is constructed of a suitably impact-resistant material. Preferably, the button portion 27 is made of a hard nickel-plated aluminum or stainless steel. The button portion 27 has an outer button end 28 and an inner button end 29. The inner button end 29 has a resiliently-biasing pressure element 31 in contact therewith, preferably mounted thereon along the center, and an abutment surface 34 which defines an abutment plane 34'. It is notable here, however, that the resiliently-biasing pressure element 31 may alternatively be merely contactedly interposed between the inner button end 29 and the piezoelectric element 22 without being mounted or otherwise secured to either. In any case, the resiliently-biasing pressure element 31 is preferably mounted in a central cavity 33 of the inner button end 29. Preferably still, where the pressure element 31 is mounted in the central cavity 33, the pressure element 31 extends below the abutment plane 34' to come into contact with the piezoelectric element 22 (see below).

The button portion 27 is adapted to be secured to the outer frame end 15 of the rigid frame 13. Preferably, this is accomplished by means of fasteners 36, such as button mounting screws 36 (See FIGS. 1 and 2), which preferably reverse extend through mounting collars 37, through holes 12 in the circuit board 11, through holes 18 in the rigid frame 13, and finally threaddedly secure to the button mounting holes 30 on the inner button end 29 of the button portion 27. The button mounting screws 36 are sufficiently threaded to the button portion 27 whereby the seal-contact portion 35 sealably contacts the resiliently-biasing sealing element 21 when the head of the button mounting screw 36 (with the mounting collar 37) abuts against the circuit board 11. In this manner, the button portion 27 cannot be removed by a pedestrian user, while enabling incremental axial displacement between the biased and unbiased positions of the resiliently-biasing sealing element.

When positioned and assembled as shown in FIG. 3, the abutment surface 34 confronts the stopper surface 17 in a close-tolerance manner impending imminent contact, a seal-contact portion 35 of the inner button end 29 contacts the resiliently-biasing sealing element 21 in an unbiased state, and the resiliently-biasing pressure element 31 contacts the piezoelectric element 22. It is notable that the contact between the seal contact portion 35 and the resiliently-biasing sealing element 21 is a sealing contact which occludes moisture and other external elements from entering the rigid frame 11. In this regard, the resiliently-biasing sealing element 21 is preferably made of an elastomeric material, such as rubber, as previously discussed. It is also notable that where the stopper surface 17 is a pair of stopper portions on opposite sides of the central aperture 16 as discussed above, the abutment surface 34 is a pair of abutment portions (not shown) confronting a corresponding stopper portion in a close tolerance manner.

Furthermore, it is notable that the term "confront" is defined and used herein and in the claims to indicate close tolerance proximity short of contact. It is appreciated that typical close-tolerance proximities between the abutment and stopper surfaces 34, 17 can be several thousandths of an inch. In a preferred embodiment, as shown in FIG. 3, the close-tolerance proximity is due to the shallow relief protrusion of the sealing element 21 beyond the stop plane 17' when in an unbiased state. In any case, the confrontation between the abutment surface 34 and the stopper surface 17 is sufficiently proximate to each other to be considered "non-moving", especially as perceived by a pedestrian user. However, the close tolerance proximity is also sufficiently spaced to enable incremental displacement between the abutment and stopper surfaces 34, 17. Moreover, the extremely close tolerance of the abutment surface 34 to the stopper surface 17 enables the pedestrian push button assembly 10 to approximate a solid body when undergoing impact, thereby withstanding violent acts of vandalism.

In a preferred embodiment, the resiliently-biasing sealing element 21 protrudes above a stopper plane 17' defined by the stopper surface 17. Furthermore, the resiliently-biasing pressure element 31 protrudes below the stopper plane 17' to come into contact with the piezoelectric element 22. It is notable that the button portion 27 is secured to the rigid frame 13 in a manner which slightly biases the sealing element 21, and slightly depresses the piezoelectric element 22 to suitably pre-load the piezoelectric element 22 for optimal generation of an electric charge thereon.

In this manner, and during operation, the pedestrian push button assembly 10 may be activated upon a user pressing the outer button end 15 of the button portion 27. The spacing between the abutment surface 34 and the stopper surface 17 is sufficiently small whereby little or no displacement is perceived by the user, while sufficiently bending the piezoelectric element 22 to produce an electric charge. Because of this, it is desirable to have an indicator, such as an LED light 41 shown in FIGS. 1 and 2, to notify the generation of a signal to the user. Preferably, as shown in FIGS. 1 and 2, the LED 41 is mounted on the rigid frame 11 via an LED mounting aperture 42. Furthermore, a secondary piezoelectric element 38 (FIGS. 1 and 2) may also be provided with a cover 39 mounted in a slot 40 of the inner frame end 14. In contrast to the primary piezoelectric element 22 positioned across the central aperture 16, the secondary piezoelectric element 38 is a piezo motor or actuator type which generates a tone or other vibrational response as a consequence of an electric field. Thus, both the LED 41 and the secondary piezoelectric element 38 provide the necessary verification to the user.

Figure 4:
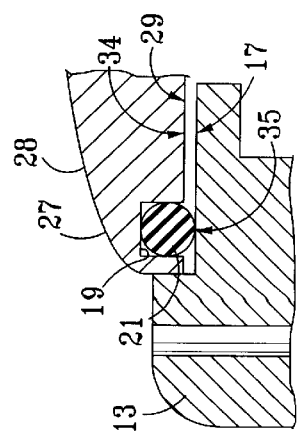

In an alternative embodiment, shown in FIG. 4, the placement of the seal contact portion 35 and the perimetric groove 19 with the resiliently-biasing sealing element 21 may be reversed, whereby the seal contact portion 35 is located on the outer frame end 15 surrounding the central aperture 16, and both the perimetric groove 19 and the resiliently-biasing sealing element 21 is located on the inner button end 29 surrounding the resiliently-biasing pressure element 31. While reverse positioned, this alternative embodiment would function in a manner similar to the above described embodiment to seal between the button portion 27 and the rigid frame 11, as well as provide the required resiliency to enable sufficient movement of the button portion 27 relative to the rigid frame 11.

The present embodiments of this invention are thus to be considered in all respects as illustrative and not restrictive; the scope of the invention being indicated by the appended claims rather than by the foregoing description. All changes which come within the meaning and range of equivalency of the claims are intended to be embraced therein.

We claim:

1. A pedestrian push button assembly for activating signal generating means to generate a signal at a street crosswalk, said pedestrian push button assembly comprising:

a rigid frame (13) having opposing inner (14) and outer (15) frame ends, said outer frame end (15) having a central aperture (16), a stopper surface (17) located ulterior to said central aperture (16), and a parametric groove (19) surrounding said central aperture (16);

a resiliently-biasing sealing element (21) adapted to be seated in said parametric groove;

a piezoelectric element (22, 23, 24) positioned across said central aperture and electrically connected to said signal generating means by electrical conduit means, wherein said piezoelectric element activates said signal generating means to generate said signal when mechanical pressure is acted thereupon; and a button portion (27) having opposing inner (29) and outer (28) button ends, said inner button end (29) having a resiliently-biasing pressure element (31) mounted thereon, an abutment surface (34) located ulterior to said resiliently-biasing pressure element (31), and a seal contact portion (35) surrounding said resiliently-biasing pressure element (31), said inner button end (29) adapted to be secured to said outer frame end (15) wherein said seal contact portion (35) sealably contacts said resiliently-biasing sealing element (21) in an unbiased state, said abutment surface (34) confronts said stopper surface (17), and said resiliently-biasing pressure element (31) contacts said piezoelectric element, and said stopper surface (17) contacts said abutment surface (34) to stop any further pressure on said resiliently-biasing pressure element (31) and on said piezoelectric element (22);

whereby, upon a pressure being applied against said outer button end, said seal contact portion resiliently-biases said resiliently-biasing sealing element, and said resiliently-biasing pressure element is urged to apply a mechanical pressure against said piezoelectric element, thereby activating said signal generating means to generate said signal and whereby the amount of pressure which can be exerted on the piezoelectric element (22) is limited by the stopping of the button portion (27) by contact between its abutment surface (34) and said stopper surface (17).

2. The push button assembly as in claim 1, wherein said stopper surface defines a stop plane, and said resiliently-biasing sealing element protrudes in shallow relief above said stop plane when in an unbiased state.

3. The push button assembly as in claim 2, wherein said seal contact portion is coplaner with said abutment surface.

4. The push button assembly as in claim 1, wherein said abutment surface confronts said stopper surface in impending imminent contact, such that relative movement between said rigid frame and said button portion is negligible as perceived by a user.

5. The push button assembly as in claim 1, wherein said piezoelectric element has a pair of opposing mounting ends supported by said inner frame end in a simple beam arrangement over said central aperture.

6. The push button assembly as in claim 1, wherein said resiliently-biasing pressure element is mounted in a central cavity of said inner button end.

7. The push button assembly as in claim 6, wherein said resiliently-biasing pressure element protrudes in shallow relief below an abutment plane defined by said abutment surface of said inner button end.

8. The push button assembly as in claim 1,
wherein said stopper surface completely surrounds said central aperture, and said abutment surface correspondingly completely surrounds said resiliently biasing pressure element.

9. The push button assembly as in claim 1,
wherein said stopper surface comprises at least first and second stopper portions positioned on opposite sides of said central aperture, and said abutment surface comprises at least first and second abutment portions correspondingly positioned on opposite sides of said resiliently biasing pressure element.

10. A pedestrian push button assembly for activating signal generating means to generate a signal at a street crosswalk, said pedestrian push button assembly comprising:

a rigid frame having opposing inner and outer frame ends, said outer frame end having a central aperture, a stopper surface located ulterior to said central aperture, and a parametric groove surrounding said central aperture;

a resiliently-biasing sealing element adapted to be seated in said parametric groove;

a piezoelectric element positioned across said central aperture and electrically connected to said signal generating means by electrical conduit means, wherein said piezoelectric element activates said signal generating means to generate said signal when mechanical pressure is acted thereupon; and a button portion having opposing inner and outer button ends, said inner button end having a resiliently-biasing pressure element mounted thereon, an abutment surface located ulterior to said resiliently-biasing pressure element, and a seal contact portion surrounding said resiliently-biasing pressure element, said inner button end adapted to be secured to said outer frame end wherein said seal contact portion sealably contacts said resiliently-biasing sealing element in an unbiased state, said abutment surface confronts said stopper surface, and said resiliently-biasing pressure element contacts said piezoelectric element, and said stopper surface contacts said abutment surface to stop any further pressure on said resiliently-biasing pressure element and on said piezoelectric element;

whereby, upon a pressure being applied against said outer button end, said seal contact portion resiliently-biases said resiliently-biasing sealing element, and said resiliently-biasing pressure element is urged to apply a mechanical pressure against said piezoelectric element, thereby activating said signal generating means to generate said signal and whereby the amount of pressure which can be exerted on the piezoelectric element is limited by the stopping of button portion by contact between its abutment surface and said stopper surface.

11. The push button assembly as in claim 10,
wherein said abutment surface defines an abutment plane, and said resiliently-biasing sealing element protrudes in shallow relief below said abutment plane when in an unbiased state.

12. The push button assembly as in claim 11,
wherein said seat contact portion is coplaner with said stopper surface.

13. The push button assembly as in claim 10,
wherein said abutment surface confronts said stopper surface in impending imminent contact, whereby relative movement between said rigid frame and said button portion is negligible as perceived by a user.

14. The push button assembly as in claim 10,
wherein said piezoelectric element has a pair of opposing mounting ends supported by said inner frame end in a simple beam arrangement over said central aperture.

15. The push button assembly as in claim 10,
wherein said resiliently-biasing pressure element is mounted in a central cavity of said inner button end.

16. The push button assembly as in claim 15,
wherein said resiliently-biasing pressure element protrudes in shallow relief below an abutment plane defined by said abutment surface of said inner button end.

17. The push button assembly as in claim 10,
wherein said stopper surface completely surrounds said central aperture, and said abutment surface correspondingly completely surrounds said resiliently biasing pressure element.

18. The push button assembly as in claim 10,
wherein said stopper surface comprises at least first and second stopper portions positioned on opposite sides of said central aperture, and said abutment surface comprises at least first and second abutment portions correspondingly positioned on opposite sides of said resiliently biasing pressure element.

* * * * *